United States Patent  
Vischer

(10) Patent No.: US 7,415,759 B2
(45) Date of Patent: Aug. 26, 2008

(54) METHOD AND APPARATUS FOR MOUNTING SEMICONDUCTOR CHIPS

(75) Inventor: Dieter Vischer, Zug (CH)

(73) Assignee: Unaxis International Trading Ltd., Cham (CH)

( * ) Notice: Subject to any disclaimer, the term of this patent is extended or adjusted under 35 U.S.C. 154(b) by 0 days.

(21) Appl. No.: 11/173,396

(22) Filed: Jul. 1, 2005

(65) Prior Publication Data

US 2006/0000082 A1 Jan. 5, 2006

(30) Foreign Application Priority Data

Jul. 2, 2004 (EP) ................................. 04103158

(51) Int. Cl.
*B23P 19/00* (2006.01)
*H05K 3/30* (2006.01)
(52) U.S. Cl. .................. 29/740; 29/832; 29/834; 198/468.4
(58) Field of Classification Search ............. 29/564.1, 29/739–741, 832–834; 198/346.2, 468.4; 228/45, 44.7, 49.1; 257/692
See application file for complete search history.

(56) References Cited

U.S. PATENT DOCUMENTS

| | | | |
|---|---|---|---|
| 6,149,047 A | | 11/2000 | Oda |
| 6,176,011 B1 * | | 1/2001 | Shirakawa ................... 29/832 |
| 6,185,815 B1 | | 2/2001 | Schindler |
| 6,519,840 B1 | | 2/2003 | Stalder |
| 6,621,157 B1 * | | 9/2003 | Wirz et al. ................... 257/692 |
| 6,792,676 B2 * | | 9/2004 | Haji et al. ..................... 29/832 |
| 2004/0246794 A1 | | 12/2004 | Vischer |
| 2005/0011067 A1 | | 1/2005 | Thuerlemann |

FOREIGN PATENT DOCUMENTS

| | | |
|---|---|---|
| EP | 0 991 110 | 4/2000 |
| JP | 2003-115502 | 4/2003 |
| JP | 2003-243484 | 8/2003 |

* cited by examiner

*Primary Examiner*—Donghai D. Nguyen
(74) *Attorney, Agent, or Firm*—Thelen Reid Brown Raysman & Steiner LLP; David B. Ritchie

(57) ABSTRACT

A method for mounting semiconductor chips onto a substrate with which substrate places are arranged in columns, whereby the semiconductor chips adhering to a foil are presented on a wafer table, whereby the detachment of a semiconductor chip from the foil is supported by means of a die ejector and whereby a pick and place device picks the semiconductor chip presented above the die ejector and deposits it onto the substrate comprises:

Forward feeding the substrate along a transport direction designated as x direction,
Equipping a predetermined number of columns with semiconductor chips in accordance with the steps:
Moving the pick and place device to an x position corresponding to the column to be equipped,
Moving the die ejector to this x position, and
Equipping the substrate places of the column.

2 Claims, 2 Drawing Sheets

METHOD AND APPARATUS FOR MOUNTING SEMICONDUCTOR CHIPS

PRIORITY CLAIM

The present application claims priority under 35 U.S.C § 119 based upon European Patent Application No. 04103158.4 filed on Jul. 2, 2004.

FIELD OF THE INVENTION

The invention concerns a method and an apparatus for mounting semiconductor chips onto a substrate.

BACKGROUND OF THE INVENTION

Different types of automatic assembly machines are known for mounting semiconductor chips onto a substrate. At one end of the spectrum one finds the so-called Die Bonders that are used in order to mount semiconductor chips onto a substrate at high speed and with great accuracy. Such Die Bonders are known for example from the patent U.S. Pat. No. 6,185,815, and the patent publications EP 991 110, US 2005-0011067 and US 2004-0246794. The semiconductor chips are presented on a wafer table. The substrates to be equipped are supplied one after the other in cycles whereby one substrate at a time is fixed to a substrate table and presented for equipping with semiconductor chips. Mounting of the semiconductor chips is done by means of a bondhead driven by a pick and place device. Die Bonders marketed by the applicant contain a pick and place device with a first fast axis that enables the transport of the semiconductor chips from the wafer table to the substrate at high speed and with a second axis running orthogonally to the first axis that allows shifting of the semiconductor chip in the range of several tens of micrometers so that any deviation of the actual position from the set position can be corrected. This concept enables a simple and favourable method of construction however limits the Die Bonder to the effect that each time only one specific semiconductor chip can be mounted onto the substrate. At the other end of the spectrum one finds so-called automatic placement machines that have two fast axes running orthogonally to each other that cover a large working area. The advantage of this concept is that several different types of semiconductors as well as other components can be mounted one after the other onto the same substrate. The disadvantage is that the assembly time is much greater than with a Die Bonder.

With the Die Bonder, the substrates are pushed forward in cycles by a transport device and, with substrates having several substrate places lying next to each other in columns, are processed column by column. The substrate is only pushed forward when a column is fully equipped with semiconductor chips. There are also applications with which several columns are combined into a block. Because the forward feed with the transport device during equipping of a block for various reasons is often undesired, Die Bonders have been developed with which the substrate table can be shifted in transport direction together with the substrate fixed to the substrate table so that the columns of a block can be equipped without having to release the fixing of the substrate to the substrate table.

From U.S. Pat. No. 6,519,840 a semiconductor mounting apparatus is known with which the position of the semiconductor chip presented on the wafer table is measured by a camera before it is picked and a correction of any positional deviation of the semiconductor chip from its set position is done in that the foil is held by the die ejector by means of vacuum and then at least the upper surface of the die ejector facing towards the foil is shifted in the plane running parallel to the underside of the foil. The movement range of this die ejector is comparatively small, as it only has to enable small correction movements.

From U.S. Pat. No. 6,149,047 a semiconductor mounting apparatus is known with which the wafer table, the pick and place device and the die ejector can be moved in two horizontal directions so that the semiconductor mounting apparatus has room in the smallest possible space despite the increasing size of the wafers. The disadvantage is the distinct slowing down of the assembly process.

BRIEF DESCRIPTION OF THE INVENTION

The object of the invention is to improve a Die Bonder in such a way that several adjacent columns of substrate places can be processed without the substrate having to be pushed forward after processing each column and without the substrate table having to be moveable in transport direction.

The invention is based on the knowledge that in principle it is possible to build a pick and place device with two fast axes with which both axes cover a working area of several centimetres but that such a construction becomes very complex when both axes have to be moved for the equipping of each semiconductor chip. On the one hand, the invention therefore proposes to equip the pick and place device with an axis running parallel to the transport direction of the substrate that covers a working area of several centimetres and, on the other hand, also equipping the die ejector that supports the detachment of the semiconductor chips from the foil with a motorised axis running parallel to the transport direction of the substrate that covers the same working area. Once a column has been completely equipped with semiconductor chips and the next column is to be equipped with semiconductor chips, this construction enables moving both the pick and place device as well as the die ejector parallel to the transport direction of the substrate so that several columns can be equipped without having to move the substrate and that during equipping of the substrate places that belong to the same column the bondhead only has to carry out possible correction movements in the transport direction of the substrate that are small in comparison with the distance between adjacent columns so that a permanent back and forth movement of the bondhead over comparatively large distances parallel to the transport direction of the substrate is omitted.

With this solution, the invention accepts an enlargement of the semiconductor mounting apparatus as the pick and place device has a two-dimensional working area. The movement range of the wafer table in the transport direction of the substrate has to be enlarged by the working area of the die ejector in order that the semiconductor chips situated at the edge of the wafer can also be positioned above the die ejector in every possible position of the die ejector and picked up by the bondhead of the pick and place device.

The invention therefore concerns a method for mounting semiconductor chips onto a substrate having at least two substrate places for accepting semiconductor chips arranged next to each other in a column, whereby the semiconductor chips adhering to a foil are presented on a wafer table, whereby the detachment of a semiconductor chip from the foil is supported by means of a die ejector and whereby a pick and place device picks the semiconductor chip presented above the die ejector and deposits it on the substrate place to be equipped. The method is characterised by the following steps:

Forward feeding the substrate along a transport direction designated as x direction, Equipping a predetermined number of columns with semiconductor chips in accordance with the steps:

Moving the pick and place device in the transport direction to an x position corresponding to the column to be equipped, Moving the die ejector to this x position, Equipping the substrate places of the column with semiconductor chips in that a) the wafer table is moved in order to present the next semiconductor chip above the die ejector, and b) the pick and place device picks the semiconductor chip presented above the die ejector and deposits it onto the substrate place to be equipped, whereby steps a and b are repeated until all substrate places of the column are equipped.

An apparatus for mounting semiconductor chips suitable for executing this method comprises a rigidly arranged substrate table with a support surface for supporting a substrate, a transport device for transporting the substrate along a predetermined transport direction, a wafer table for presenting a semiconductor chip, a die ejector for supporting detachment of the semiconductor chip from the wafer table and a pick and place device with a bondhead for picking the semiconductor chip presented above the die ejector and placing the picked semiconductor chip onto the substrate. The die ejector is moveable by a predetermined distance d0 parallel to the transport direction of the substrate by means of a drive and the wafer table is moveable by a predetermined distance DW=P+d0 parallel to the transport direction, whereby the quantity P designates the diameter of the largest wafer for the accommodation of which the wafer table (and the apparatus) are designed.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE INVENTION

Figure 1:
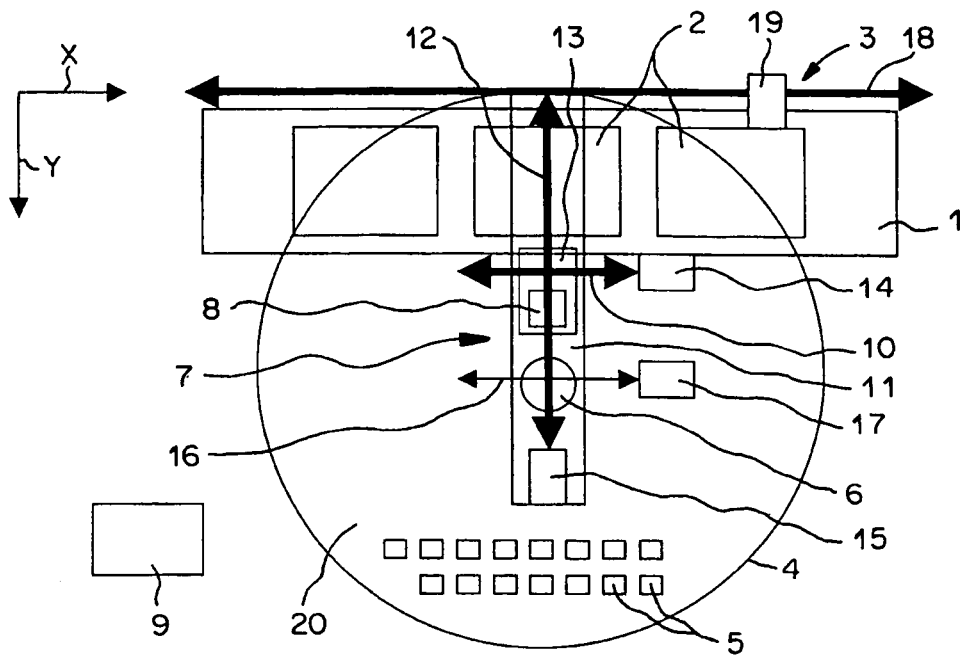
FIG. 1 shows a schematic plan view of a semiconductor mounting apparatus.

The invention concerns a semiconductor mounting apparatus that is known in the trade as a Die Bonder. FIG. 1 shows a schematic plan view of such a semiconductor mounting apparatus. The semiconductor mounting apparatus comprises a rigidly arranged substrate table 1 with a support surface for the substrate 2, a transport device 3 for transporting the substrate 2 along a predetermined transport direction designated as x direction, a wafer table 4 with the semiconductor chips 5 to be mounted, a die ejector 6 to support detachment of the next semiconductor chip 5 to be mounted from the wafer table 4, a pick and place device 7 with a bondhead 8 that picks the semiconductor chip presented above the die ejector 6 and places it onto the substrate 2, and a control device 9. The pick and place device 7 enables movements of the bondhead 8 along two directions running orthogonally to each other designated as x and y. The pick and place device 7 contains a first, stationary arranged guide 10 on which a first shuttle 11 bears that is moveable back and forth in x direction. The first shuttle 11 contains a second guide 12 on which a second shuttle 13 bears that is moveable back and forth in y direction. The bondhead 8 is located on the second shuttle 13. Each of the two shuttles 11 and 13 is driven by a drive 14 and 15. The two shuttles 11 and 13 therefore enable movements of the bondhead 8 in x and y direction. The die ejector 6 bears on a third guide 16 and is moveable in x direction, ie, parallel to the transport direction of the substrate 2, by means of a further drive 17. From a middle position designated as $x_0$, the first shuttle 11 as well as the die ejector 6 can be moved back and forth in x direction within a predetermined working area $[x_0-d, x_0+d]$. The distance d amounts for example to 40 millimetres. The transport device 3 comprises for example a guide 18 for guiding at least one moveable clamp 19. The transport device 3 transports the substrates 2 one after the other to the bonding location where the pick and place device 7 deposits each semiconductor chip onto a respective substrate place. In the figure, the four guides 10, 12, 16 and 18 are presented symbolically with arrows that illustrate the moving area of the shuttles 11 and 13, the die ejector 6 as well as the clamp 19.

The semiconductor chips 5 adhere to a foil 20 clamped in a frame (known in the trade as blue tape). The wafer table 4 accommodates the frame. With the semiconductor mounting apparatus in accordance with prior art, the die ejector 6 is arranged stationary. The wafer table 4 is moveable parallel and orthogonal to the transport direction of the substrate 2, ie, in x direction and in y direction, so that one semiconductor chip 5 after the other can be positioned above the die ejector 6 from where it can be picked by the bondhead 8 and mounted on the presented substrate 2. The movement range $D_w$ of the wafer table 4 in x direction has to be enlarged by the distance $d_0=2d$ whereby the distance d, as given above, characterises the working area $[x_0-d, x_0+d]$ of the die ejector 6, so that, in every possible x position of the die ejector 6, the semiconductor chips 5 situated at the edge of the wafer can also be positioned above the die ejector 6 and picked up by the bondhead 8 of the pick and place device 7. The movement area $D_w$ of the wafer table 4 in x direction therefore amounts to $P+d_0$, whereby P designates the diameter of the largest wafer for acceptance of which the wafer table 4 is designed or specified.

The control device 9 is arranged to synchronously move the pick and place device 7 and the die ejector 6 parallel to the transport direction of the substrate 2 so that substrates with which at least two substrate places for accepting semiconductor chips are arranged next to each other in a column can be equipped column by column with semiconductor chips without the bondhead 8 having to be moved parallel to the transport direction of the substrate 2 except for comparatively small correction movements.

In order that the semiconductor chips 5 can be placed with great positional accuracy onto the substrate places, the position of the semiconductor chip presented above the die ejector 6 and the position of the substrate place are measured with appropriate cameras and converted into motion signals for the pick and place device.

Figure 2:
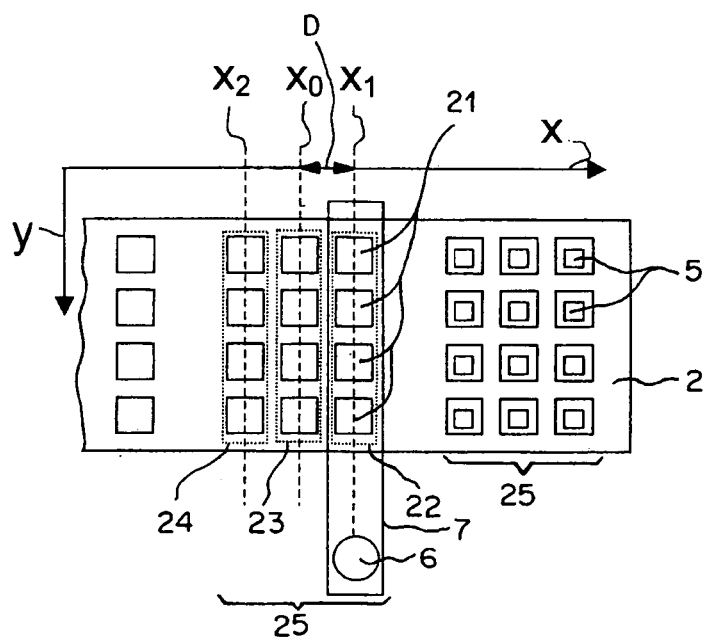
FIG. 2-4 show different snapshots during equipping of a substrate with semiconductor chips that has substrate places arranged in columns.
Figure 3:
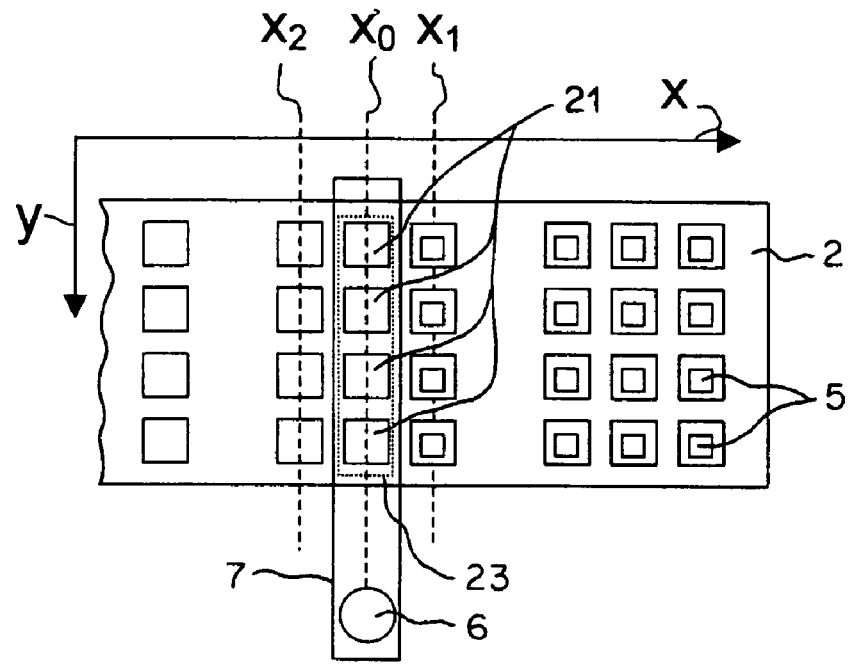
Figure 4:
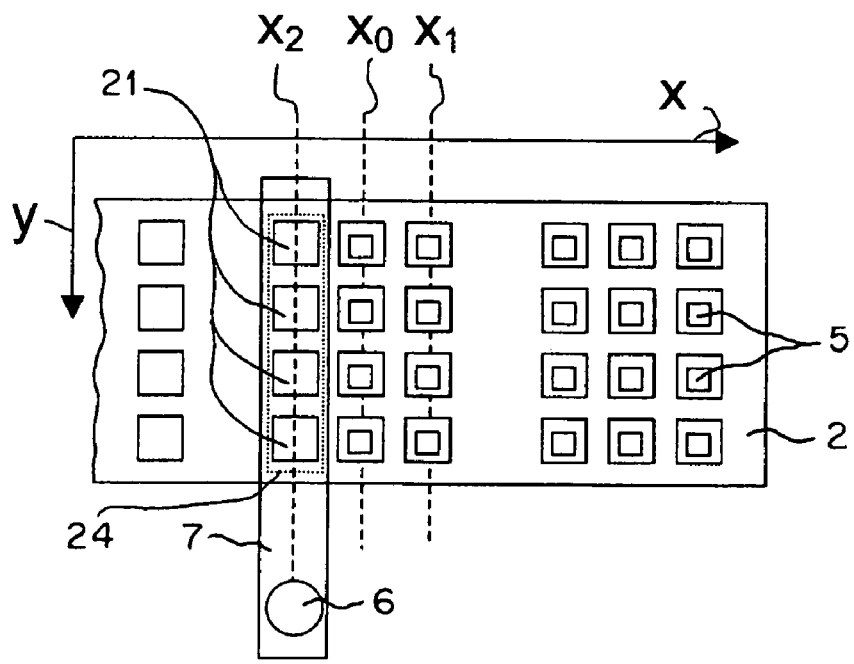

FIGS. 2 to 4 give a representative illustration of such a method for mounting semiconductor chips onto a substrate with which four substrate places 21 for accepting semiconductor chips are arranged next to each other in a column and with which three successive columns 22, 23 and 24 form a block 25. Equipping of the substrate places of such a block 25 takes place in accordance with the following process steps:

The substrate 2 is pushed forward in x direction by the transport device 3 until the middle column 23 assumes the x position $x_0$. The x position of the first column 22 is designated as $x_1$, the x position of the third column 24 is designated as $x_2$. The positions $x_1$ and $x_2$ result from the position $x_0$ corresponding to the distance D between two adjacent columns of the block 25.

The pick and place device 7 is brought into the x position $x_1$ in which its y axis is centred above the first column 22. The die ejector 6 is also brought into the x position $x_1$. This condition is presented in FIG. 2.

The substrate places 21 of the first column 22 are equipped one after the other in that
  a) the wafer table 4 is moved in order to present the next semiconductor chip 5 above the die ejector 6, and
  b) the pick and place device 7 picks the semiconductor chip 5 presented above the die ejector 6 and deposits it onto the substrate place 21 to be equipped. With this process, the bondhead 8 (FIG. 1) of the pick and place device 7 covers a comparatively large distance in y direction. However, in x direction the bondhead 8 only carries out a comparatively small correction movement Δx in order to eliminate any wrong positioning of the semiconductor chip. "Small" correction movement means that Δx is very small in comparison with the distance D between adjacent columns.

Steps a and b are repeated until all substrate places 21 of the first column 22 are equipped.

The middle column 23 is then equipped with semiconductor chips. Therefore, to equip the second, middle column 23, the pick and place device 7 is brought into the x position $x_0$ in which its y axis is centred above the middle column 23.

The die ejector 6 is brought into the x position $x_0$. This condition is presented in FIG. 3.

The substrate places 21 of the middle column 23 are now equipped one after the other in that
  a) the wafer table 4 is moved in order to present the next semiconductor chip 5 above the die ejector 6, and
  b) the pick and place device 7 picks the semiconductor chip 5 presented above the die ejector 6 and deposits it onto the substrate place to be equipped, whereby the bondhead 8 only carries out a comparatively small correction movement in x direction.

Steps a and b are repeated until all substrate places 21 of the middle column 23 are equipped.

The third column 24 is then equipped with semiconductor chips. Therefore, to equip the third column 24, the pick and place device 7 is brought into the x position $x_2$ in which its y axis is centred above the third column 24. The die ejector 6 is brought into the x position $X_2$. This condition is presented in FIG. 4.

The substrate places 21 of the third column 24 are now equipped one after the other in that
  a) the wafer table 4 is moved in order to present the next semiconductor chip 5 above the die ejector 6, and
  b) the pick and place device 7 picks the semiconductor chip 5 presented above the die ejector 6 and deposits it onto the substrate place to be equipped, whereby the bondhead 8 only carries out a comparatively small correction movement in x direction.

Steps a and b are repeated until all substrate places 21 of the third column 24 are equipped.

All three columns 22, 23 and 24 of the same block 25 are now equipped. To equip the next block, the substrate 2 is now pushed forward correspondingly by the transport device 3 until the middle column of the next block assumes the position $x_0$. The three columns are then equipped with semiconductor chips 5 as described above.

While embodiments and applications of this invention have been shown and described, it would be apparent to those skilled in the art having the benefit of this disclosure that may more modifications than mentioned above are possible without departing from the inventive concepts herein. The invention, therefore, is not to be restricted except in the spirit of the appended claims and their equivalents.

What is claimed is:

1. A method for mounting semiconductor chips onto a substrate whereby semiconductor chips adhered to a foil are presented on a wafer table, detachment of a semiconductor chip from the foil is accomplished using a die ejector and a pick and place device picks the semiconductor chip presented above the die ejector and deposits the semiconductor chip on a substrate place, the method comprising:
  providing the substrate having a plurality, n, of substrate places for accepting n of semiconductor chips arranged next to each other in a column, whereby the column runs orthogonally to a transport direction designated as x direction;
  forward-feeding the substrate along the transport direction; and
  mounting semiconductor chips on a predetermined number of columns in accordance with the steps:
    moving the pick and place device in the transport direction to an x position corresponding to a respective column on the substrate,
    moving the die ejector to the x position corresponding to the respective column,
    placing n semiconductor chips on the n substrate places of the column without moving the substrate in the transport direction and without moving the pick and place device in the transport direction except for correction movements that are small in comparison with a distance between adjacent columns and without moving the die ejector, the placing including the substeps iteratively executed n times:
      moving the wafer table to present a next semiconductor chip above the die ejector, and
    using the pick and place device to pick the semiconductor chip presented above the die ejector and deposit the semiconductor chip on a respective substrate 23 and 24 place of the respective column.

2. An apparatus for mounting semiconductor chips onto a substrate whereby semiconductor chips adhered to a foil are presented on a wafer table, detachment of a semiconductor chip from the foil is accomplished using a die ejector and a pick and place device picks the semiconductor chip presented above the die ejector and deposits the semiconductor chip on a substrate place, the apparatus comprising:
  means for providing the substrate having a plurality, n, of substrate places for accepting n of semiconductor chips arranged next to each other in a column, whereby the column runs orthogonally to a transport direction designated as x direction;
  means for forward-feeding the substrate along the transport direction; and
  means for mounting semiconductor chips on a predetermined number of columns on the substrate without moving the substrate in the transport direction, the means for mounting including:
    means for moving the pick and place device in the transport direction to an x position corresponding to the respective column, means for moving the die ejector to the x position corresponding to the respective column,
means for placing n semiconductor chips on the n substrate places of the predetermined number of columns without moving the pick and place device in the transport direction except for correction movements that are small in comparison with a distance between adjacent columns and without moving the die ejector, the means for placing further configured to:

iteratively move the wafer table n times to present a next semiconductor chip above the die ejector, and iteratively use the pick and place device n times to pick the semiconductor chip presented above the die ejector and deposit the semiconductor chip on the respective substrate place of the respective column.

* * * * *